(12) United States Patent
Cornfeld et al.

(10) Patent No.: US 7,741,146 B2
(45) Date of Patent: Jun. 22, 2010

(54) DEMOUNTING OF INVERTED METAMORPHIC MULTIJUNCTION SOLAR CELLS

(75) Inventors: Arthur Cornfeld, Sandia Park, NM (US); Tansen Varghese, Albuquerque, NM (US); Jacqueline Diaz, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 38 days.

(21) Appl. No.: 12/190,449

(22) Filed: Aug. 12, 2008

(65) Prior Publication Data

US 2010/0041178 A1  Feb. 18, 2010

(51) Int. Cl.
*H01L 21/00* (2006.01)
(52) U.S. Cl. .................. 438/87; 438/459; 257/E21.125
(58) Field of Classification Search .................. 438/87, 438/93, 459, 606; 257/E21.125
See application file for complete search history.

(56) References Cited

U.S. PATENT DOCUMENTS

| 4,001,864 | A | 1/1977 | Gibbons et al. |
|---|---|---|---|
| 4,255,211 | A | 3/1981 | Fraas |
| 4,338,480 | A | 7/1982 | Antypas et al. |
| 4,612,408 | A | 9/1986 | Moddel et al. |
| 5,019,177 | A | 5/1991 | Wanlass et al. |
| 5,053,083 | A | 10/1991 | Sinton et al. |
| 5,217,539 | A | 6/1993 | Fraas et al. |
| 5,322,572 | A | 6/1994 | Wanlass et al. |
| 5,342,453 | A | 8/1994 | Olson |
| 5,376,185 | A | 12/1994 | Wanlass |
| 5,479,032 | A | 12/1995 | Forrest et al. |
| 5,944,913 | A | 8/1999 | Hou et al. |

(Continued)

FOREIGN PATENT DOCUMENTS

FR  2 878 076 A1  5/2006

(Continued)

OTHER PUBLICATIONS

R. Venkatasubramanian, et al., "An Inverted-Growth Approach to Development of an IR-Transparent, High-Efficiency AlGaAs/GaAs Cascade Solar Cell." $22^{nd}$ IEEE Photovoltaic Specialists Conference, Oct. 7-11, 1991, Las Vegas, NV, USA.

(Continued)

*Primary Examiner*—Chandra Chaudhari

(57) ABSTRACT

A method of forming a multifunction solar cell including an upper subcell, a middle subcell, and a lower subcell by providing a first substrate for the epitaxial growth of semiconductor material; forming a first solar subcell on the substrate having a first band gap; forming a second solar subcell over the first solar subcell having a second band gap smaller than the first band gap; forming a graded interlayer over the second subcell, the graded interlayer having a third band gap greater than the second band gap; forming a third solar subcell over the graded interlayer having a fourth band gap smaller than the second band gap such that the third subcell is lattice mismatched with respect to the second subcell; attaching a surrogate second substrate over the third solar subcell and removing the first substrate; and etching a first trough around the periphery of the solar cell to the surrogate second substrate so as to form a mesa structure on the surrogate second substrate and facilitate the removal of said solar cell from the surrogate second substrate.

12 Claims, 22 Drawing Sheets

U.S. PATENT DOCUMENTS

| | | | |
|---|---|---|---|
| 6,180,432 | B1 | 1/2001 | Freeouf |
| 6,194,245 | B1 * | 2/2001 | Tayanaka .................... 438/57 |
| 6,239,354 | B1 | 5/2001 | Wanlass et al. |
| 6,252,287 | B1 | 6/2001 | Kurtz et al. |
| 6,281,426 | B1 | 8/2001 | Olson et al. |
| 6,300,557 | B1 | 10/2001 | Wanlass et al. |
| 6,300,558 | B1 | 10/2001 | Takamoto et al. |
| 6,340,788 | B1 | 1/2002 | King et al. |
| 6,482,672 | B1 | 11/2002 | Hoffman et al. |
| 6,660,928 | B1 | 12/2003 | Patton et al. |
| 6,951,819 | B2 | 10/2005 | Iles et al. |
| 7,071,407 | B2 | 7/2006 | Faterni et al. |
| 2002/0117675 | A1 | 8/2002 | Mascarenhas |
| 2004/0200523 | A1 | 10/2004 | King et al. |
| 2006/0021565 | A1 | 2/2006 | Zahler et al. |
| 2006/0144435 | A1 | 7/2006 | Wanlass et al. |
| 2006/0162768 | A1 | 7/2006 | Wanlass et al. |
| 2007/0218649 | A1 | 9/2007 | Hernandez |
| 2007/0277873 | A1 | 12/2007 | Cornfeld et al. |
| 2008/0185038 | A1 | 8/2008 | Sharps |
| 2008/0245409 | A1 | 10/2008 | Varghese et al. |

FOREIGN PATENT DOCUMENTS

WO     WO 2005/015638 A1     2/2005

OTHER PUBLICATIONS

M. Yamaguchi, "Physics and Technologies of Superhigh-Effficiency Tandem Solar Cells." Semiconductors, vol. 33, No. 9, Sep. 1999, pp. 961-964. Toyota Technological Institute, Nagoya, Japan. ©1999, American Institute of Physics.

R.R. King, et al., "Next-Generation, High-Efficiency III-V Multijunction Solar Cells." 28$^{th}$ IEEE Photovoltaic Specialists Conference, Sep. 15-22, 2000, Anchorage, AK, USA.

S. Sinharoy, et al., "Progress in the Development of Metamorphic Multi-junction III-V Space Solar Cells." Progress in Photovoltaics: Research and Applications, vol. 10, Feb. 2002, pp. 427-432. John Wiley & Sons, Ltd. Hoboken, NJ, USA.

R.R. King, et al., "High-Efficiency Space and Terrestrial Multijunction Solar Cells Through Bandgap Control in Cell Structures." 2002 Photovoltaic Specialists Conference, Conference Record of the 29$^{th}$ IEEE, May 19-24, 2002, pp. 776-781. New Orleans, LA, USA.

M.W. Wanlass et al., "Lattice-Mismatched Approaches for High-Performance, III-V Photovoltaic Energy Converters." Proceedings of the 31$^{st}$ IEEE PVSC, Jan. 3-7, 2005, Lake Buena Vista, FL, USA.

Takamoto, T., et al., "InGaP/GaAs-based Multijunction Solar Cells." Progress in Photovoltaics: Research and Applications, 2005; vol. 13, pp. 495-511. Wiley InterScience, John Wiley & Sons, Ltd., Hoboken, NJ.

M.W. Wanlass et al., "Monolithic, Ultra-Thin GaInP/GaAs/GaInAs Tandem Solar Cells." 2006 IEEE 4$^{th}$ World Conference on Photovoltaic Energy Conversion, May 7-12, 2006, Waikoloa, Hawaii, USA.

D.J. Friedman, et al., "0.7-eV GaInAs Junction for a GaInP/GaAs/GaInAs(1eV)/GaInAs(0.7eV) Cell." 2006 IEEE 4$^{th}$ World Conference on Photovoltaic Energy Conversion, May 7-12,1006, Waikoloa, hawaii, USA.

J.F. Geisz, et al., "High-efficiency GaInP/GaAs/InGaAs triple-junction solar cells grown inverted with a metamorphic bottom junction." Applied Physics Letters 91, 023502 (2007), pp. 023502-1-023502-3. Online publication Jul. 10, 2007. American Institute of Physics, Melville, NY, USA.

P. Sharps, et al., "Inverting the triple junction improves efficiency and flexibility." Compound Semiconductor. Oct. 2007, pp. 25-28. IOP Publishing, Ltd., Bristol, England.

H. Yoon, et al., "Progress of Inverted Metamorphic III-V Solar Cell Development at Spectrolab." 33$^{rd}$ IEEE Photovoltaic Specialists Conference, May 11-16, 2008, San Diego, CA, USA.

J.F. Geisz, et al., "Inverted GaInP / (In)GaAs / InGaAs Triple-Junction Solar Cells with Low-Stress Metamorphic Bottom Junctions." 33$^{rd}$ IEEE Photovoltaic Specialists Conference, May 11-16, 2008, San Diego, CA, USA.

A. Cornfeld, et al., "Development of a Large Area Inverted Metamorphic Multi-junction (IMM) Highly Efficient AM0 Solar Cell." 33$^{rd}$ IEEE Photovoltaic Specialists Conference, May 11-16, 2008, San Diego, CA, USA.

A. Cornfeld, et al., "Development of a Large Area Inverted Metamorphic Multi-junction Highly Efficient AM0 Solar Cell." Conference paper presented at the 33$^{rd}$ IEEE Photovoltaic Specialists Conference (May 11-16, 2008) on May 12, 2008. San Diego, CA, USA. 17 pages.

M. Stan, et al., "Very High Efficiency Triple Junction Solar Cells by MOVPE." 14$^{th}$ International Conference of Metalorganic Vapor Phase Epitaxy. Jun. 1-6, 2008, Metz, France.

A. Cornfeld, et al., "Advances in the Performance of Inverted Metamorphic Multi-junction Solar Cells." 23$^{rd}$ European Photovoltaic Energy Conference, Sep. 1-5, 2008, Valencia, Spain.

"Partial European Search Report," Application No. EP 08 01 3466. Feb. 12, 2009. European Patent Office, Berlin, Germany.

* cited by examiner

DEMOUNTING OF INVERTED METAMORPHIC MULTIJUNCTION SOLAR CELLS

GOVERNMENT RIGHTS STATEMENT

This invention was made with government support under Contract No. FA9453-06-C-0041 awarded by the U.S. Air Force. The Government has certain rights in the invention.

REFERENCE TO RELATED APPLICATIONS

This application is related to co-pending U.S. patent application Ser. No. 12/218,582 filed Jul. 18, 2008.

This application is related to co-pending U.S. patent application Ser. No. 12/218,558 filed Jul. 17, 2008.

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. patent application Ser. No. 12/047,842, and U.S. Ser. No. 12/047,944, filed Mar. 13, 2008.

This application is related to co-pending U.S. patent application Ser. No. 12/023,772, filed Jan. 31, 2008.

This application is related to co-pending U.S. patent application Ser. No. 11/956,069, filed Dec. 13, 2007.

This application is also related to co-pending U.S. patent application Ser. Nos. 11/860,142 and 11/860,183 filed Sep. 24, 2007.

This application is also related to co-pending U.S. patent application Ser. No. 11/836,402 filed Aug. 8, 2007.

This application is also related to co-pending U.S. patent application Ser. No. 11/616,596 filed Dec. 27, 2006.

This application is also related to co-pending U.S. patent application Ser. No. 11/614,332 filed Dec. 21, 2006.

This application is also related to co-pending U.S. patent application Ser. No. 11/445,793 filed Jun. 2, 2006.

This application is also related to co-pending U.S. patent application Ser. No. 11/500,053 filed Aug. 7, 2006.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Such devices are also known as inverted metamorphic multifunction solar cells.

2. Description of the Related Art

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as concentrator terrestrial power systems and satellites used in data communications have dramatically increased the demand for solar cells with improved power and energy conversion characteristics.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often fabricated in vertical, multifunction structures, and disposed in horizontal arrays, with the individual solar cells connected together in a series. The shape and structure of an array, as well as the number of cells it contains, are determined in part by the desired output voltage and current.

Inverted metamorphic solar cell structures such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005) present an important conceptual starting point for the development of future commercial high efficiency solar cells. The structures described in such reference present a number of practical difficulties relating to the appropriate choice of materials and fabrication steps, for a number of different layers of the cell.

Prior to the present invention, the materials and fabrication steps disclosed in the prior art have not been adequate to produce a commercially viable and energy efficient solar cell using commercially established fabrication processes for producing an inverted metamorphic multifunction cell structure.

SUMMARY OF THE INVENTION

A method of forming a multifunction solar cell comprising an upper subcell, a middle subcell, and a lower subcell, by providing a first substrate for the epitaxial growth of semiconductor material; forming an upper first solar subcell on said first substrate having a first band gap; forming a middle second solar subcell over said first solar subcell having a second band gap smaller than said first band gap; forming a graded interlayer over said second solar cell; forming a lower third solar subcell over said graded interlayer having a fourth band gap smaller than said second band gap such that said third subcell is lattice mismatched with respect to said second subcell; attaching a surrogate second substrate over said third solar subcell and removing said first substrate; and etching a first trough around the periphery of said solar cell to the surrogate second substrate so as to form a mesa structure on said surrogate second substrate and facilitate the removal of said solar cell from the surrogate second substrate.

A method of manufacturing a solar cell by providing a first semiconductor substrate for the epitaxial growth of semiconductor material; forming a first subcell on said substrate comprising a first semiconductor material with a first band gap and a first lattice constant; forming a second subcell comprising a second semiconductor material with a second band gap and a second lattice constant, wherein the second band gap is less than the first band gap and the second lattice constant is greater than the first lattice constant; and forming a lattice constant transition material positioned between the first subcell and the second subcell, said lattice constant transition material having a lattice constant that changes gradually from the first lattice constant to the second lattice constant; attaching a surrogate second substrate over the second subcell and removing said first substrate, and etching a trough around the periphery of the solar cell to the surrogate second substrate to facilitate the removal of the solar cell from the surrogate second substrate.

In another aspect of the present invention a method of manufacturing a solar cell by providing a first semiconductor substrate; depositing on the first substrate a sequence of layers of semiconductor material forming a solar cell including a metal contact layer; mounting a surrogate second substrate on top of the sequence of layers; removing the first substrate; simultaneously etching first and second troughs around the periphery of said solar cell, wherein the first trough lies within the second trough so as to form first and second mesa structures on the surrogate second substrate; and etching said second trough down to said metal contact layer.

In another aspect the present invention provides a method of manufacturing a solar cell by providing a first semiconductor substrate; depositing on the first substrate a sequence of layers of semiconductor material forming a solar cell, including a metal contact layer; mounting a surrogate second substrate on top of the sequence of layers; removing the first substrate; simultaneously etching first and second troughs around the periphery of the solar cell wherein the first trough lies within the second trough so as to form first and second mesa structures on the surrogate second substrate; and etching said second trough down to said metal contact layer.

Some implementations or embodiments may incorporate or implement fewer of the aspects or features noted in the foregoing summaries.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1:
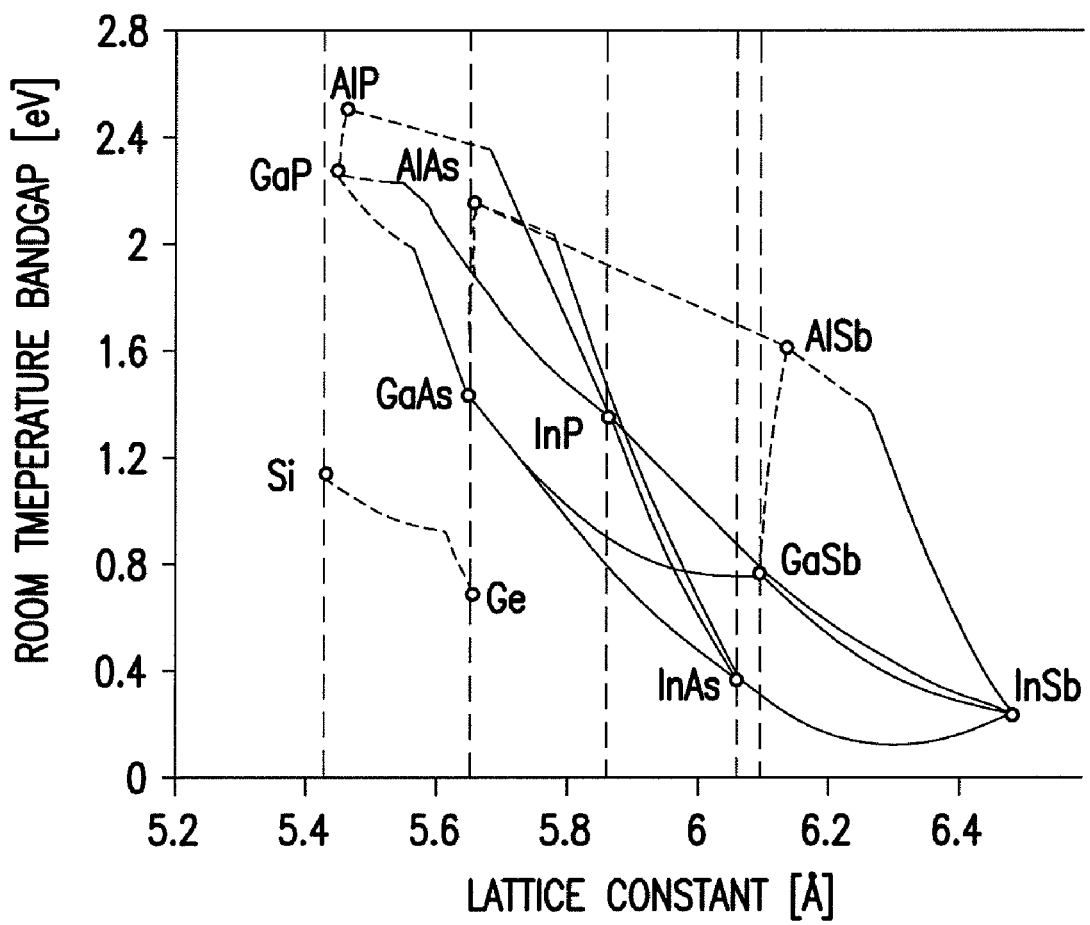
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e. a band gap in the range of 0.7 to 1.2 eV). A surrogate substrate or support structure is provided over the "bottom" or substantially lattice-mismatched lower subcell, and the growth semiconductor substrate is subsequently removed. (The growth substrate may then subsequently be re-used for the growth of a second and subsequent solar cells).

The present invention is directed to the structures and processes for the simplified demounting of the solar cell from the surrogate substrate. One aspect of fabrication of an IMM solar cell is the requirement for attachment to a surrogate substrate of support (also called a "handler") during fabrication. Such attachment is typically done by a temporary adhesive.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
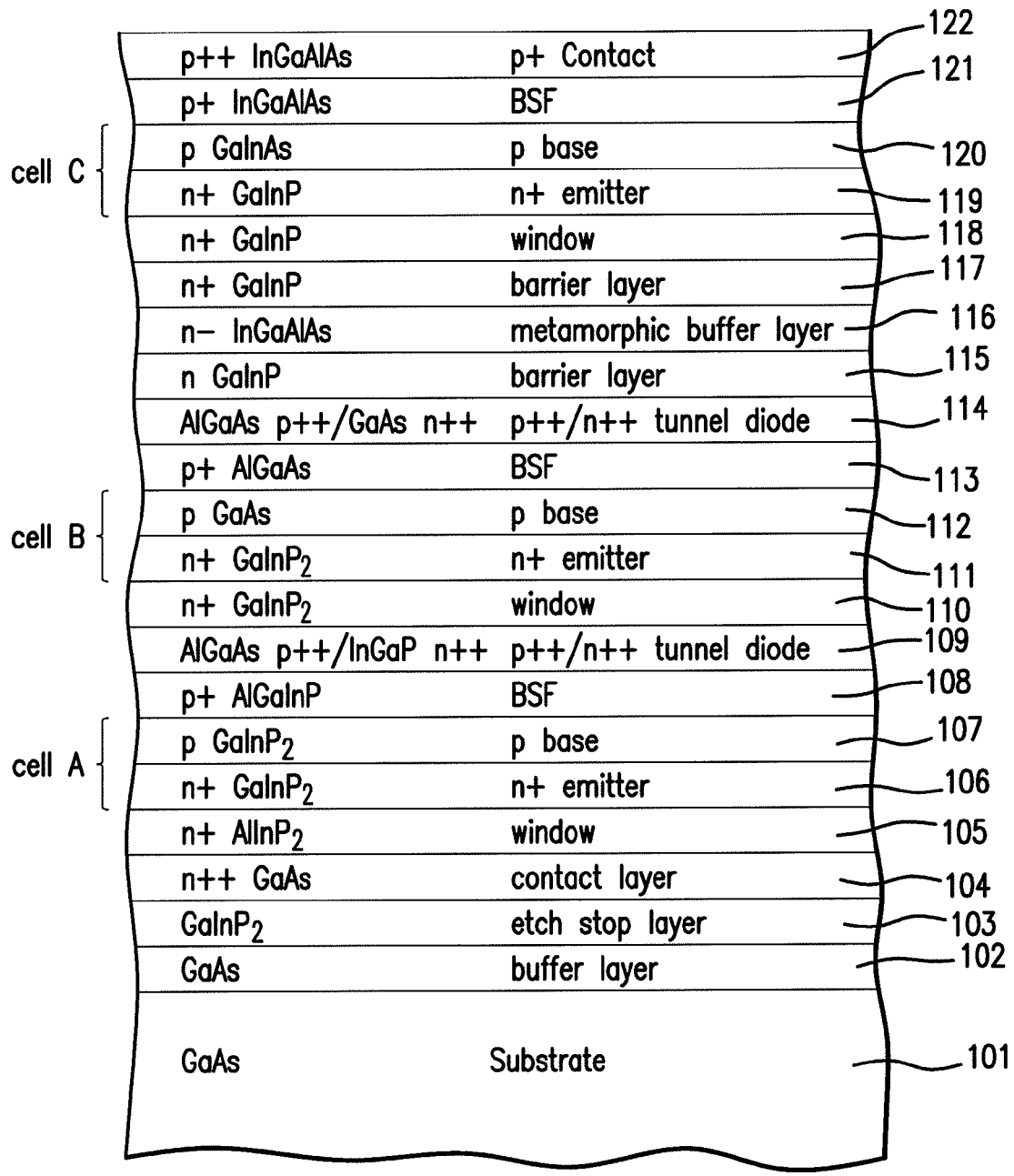
FIG. 2 is a cross-sectional view of the solar cell of the invention after the deposition of semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 16.

Subcell A will ultimately become the "top" subcell of the inverted metamorphic structure after completion of the process steps according to the present invention to be described hereinafter.

On top of the base layer 107 a back surface field ("BSF") layer 108 is deposited and used to reduce recombination loss, preferably p+ AlGaInP.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109 which forms a tunnel diode which is an ohmic circuit element to connect subcell A to subcell B. These layers are preferably composed of p++ AlGaAs, and n++ InGaP.

On top of the tunnel diode layers 109 a window layer 110 is deposited, preferably n+ InGaP. The window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 16.

In the preferred embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the middle subcell B nor the bottom subcell C emitters will be exposed to absorbable radiation. Substantially radiation will be absorbed in the bases of cells B and C, which have narrower band gaps then the emitters. Therefore, the advantages of using heterojunction subcells are: 1) the short wavelength response for both subcells will improve, and 2) the bulk of the radiation is more effectively absorbed and collected in the narrower band gap base. The effect will be to increase $J_{sc}$.

On top of the cell B is deposited a BSF layer 113 which performs the same function as the BSF layer 109. A p++/n++ tunnel diode 114 is deposited over the BSF layer 113 similar to the layers 109, again forming an ohmic circuit element to connect subcell B to subcell C. These layers 114 are preferably compound of p++ AlGaAs and either n++ GaAs or n++ InGaP.

A barrier layer 115, preferably composed of n-type InGa(Al)P, is deposited over the tunnel diode 114, to a thickness of about 1.0 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The bandgap of layer 116 is constant throughout its thickness preferably approximately 1.5 eV or otherwise consistent with a value slightly greater than the bandgap of the middle subcell B. The preferred embodiment of the graded interlayer may also be expressed as being composed of $(In_xGa_{1-x})_yAl_{1-y}As$, with x and y selected such that the band gap of the interlayer remains constant at approximately 1.50 eV.

In the surfactant assisted growth of the metamorphic layer 116, a suitable chemical element is introduced into the reactor during the growth of layer 116 to improve the surface characteristics of the layer. In the preferred embodiment, such element may be a dopant or donor atom such as selenium (Se) or tellurium (Te). Small amounts of Se or Te are therefore incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P of InGaP, or as in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In the preferred embodiment of the present invention, the layer 116 is composed of a plurality of layers of InGaAlAs, with monotonically changing lattice constant, each layer having the same bandgap, approximately 1.5 eV.

The advantage of utilizing a constant bandgap material such as InGaAlAs is that arsenide-based semiconductor material is much easier to process in standard commercial MOCVD reactors, while the small amount of aluminum assures radiation transparency of the metamorphic layers.

Although the preferred embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and n+ type InGaAs respectively, or n+ type InGaP and p type InGaAs for a heterojunction subcell, although another suitable materials consistent with lattice constant and bandgap requirements may be used as well. The doping profile of layers 119 and 120 will be discussed in connection with FIG. 16.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multifunction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 3:
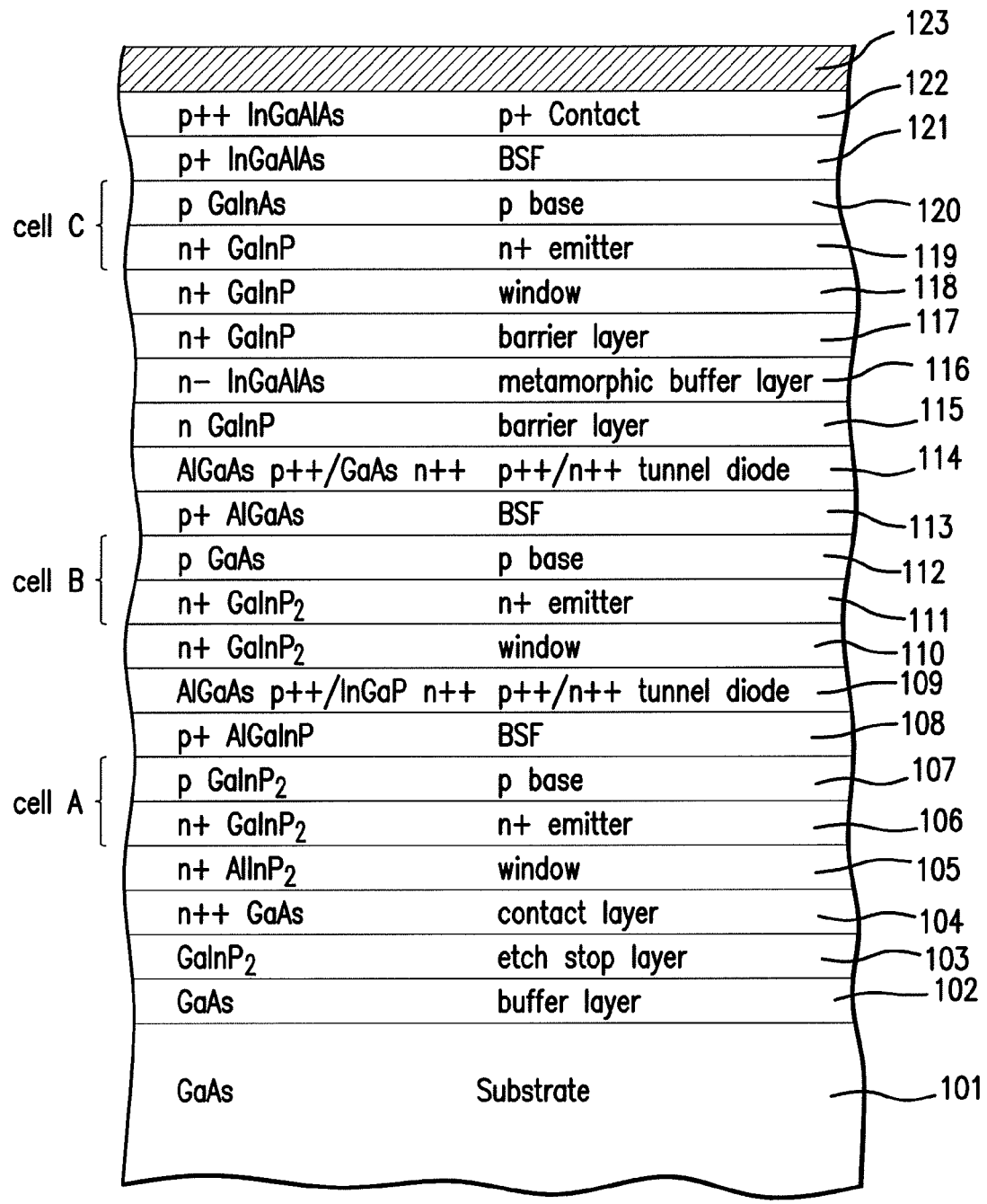
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. The metal is preferably the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 4:
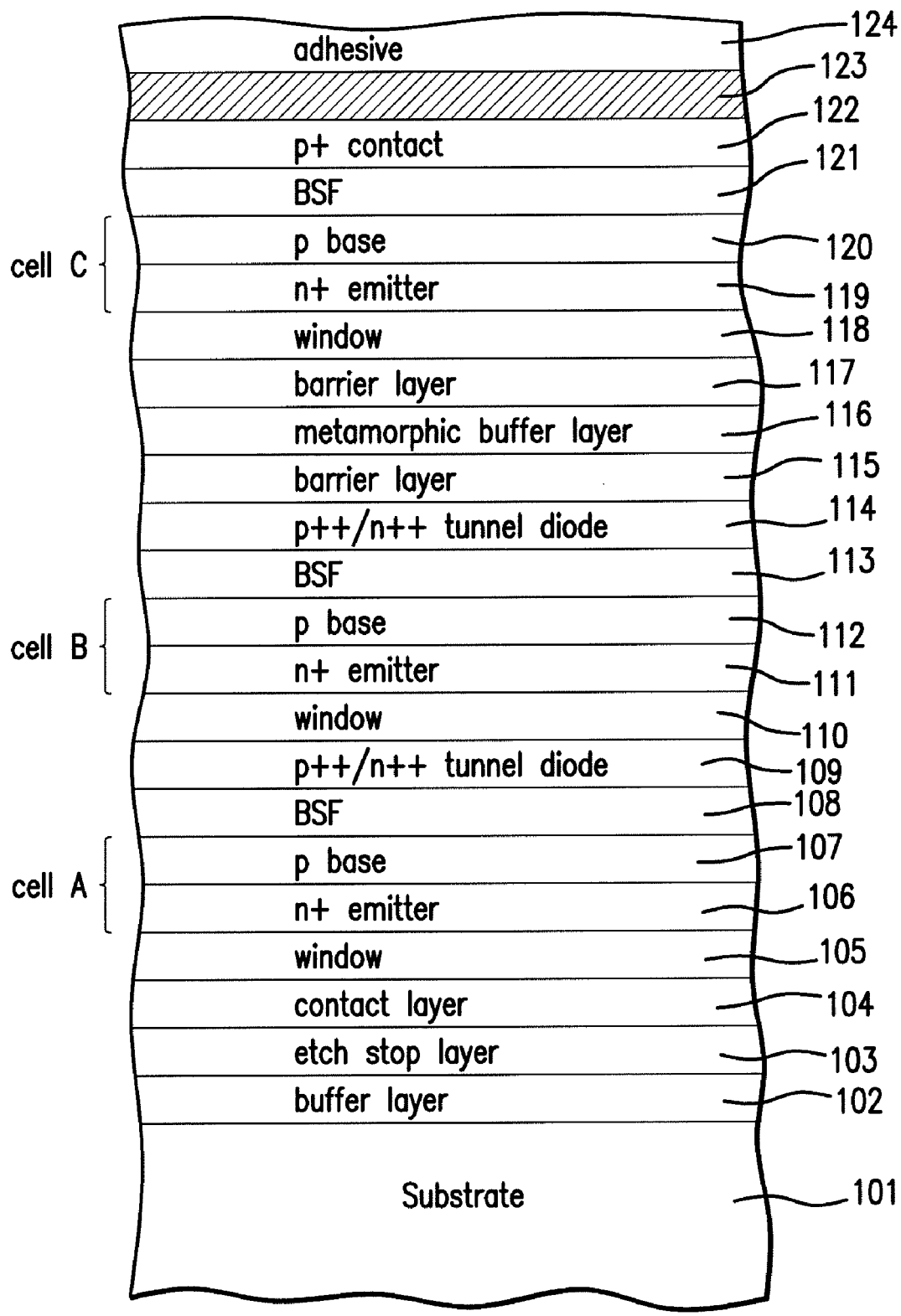
FIG. 4 is a cross-sectional view of the solar cell of FIG. 3 after next process step.

FIG. 4 is a cross-sectional view of the solar cell of FIG. 3 after the next process step in which an adhesive layer 124 is deposited over the metal layer 123. The adhesive is preferably Wafer Bond (manufactured by Brewer Science, Inc. of Rolla, Mo.).

Figure 5A:
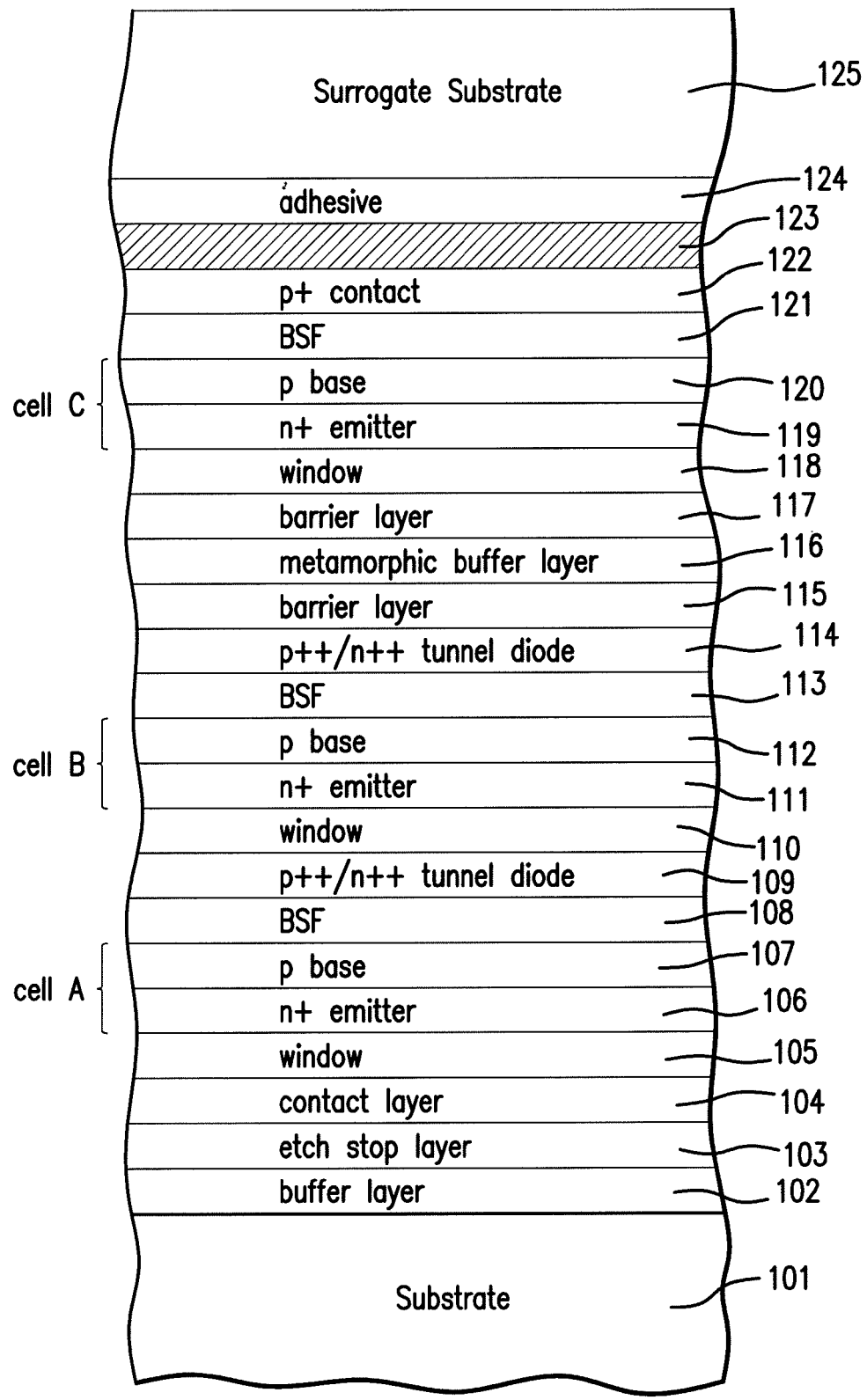
FIG. 5A is a cross-sectional view of the solar cell of FIG. 4 after the next process step in which a surrogate substrate is attached.

FIG. 5A is a cross-sectional view of the solar cell of FIG. 4 after the next process step in which a surrogate substrate 125, preferably sapphire, is attached. Alternative, the surrogate substrate may be GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. As an alternative to using an adhesive layer 124, a suitable substrate (e.g., GaAs) may be bonded to the metal layer 123.

Figure 5B:
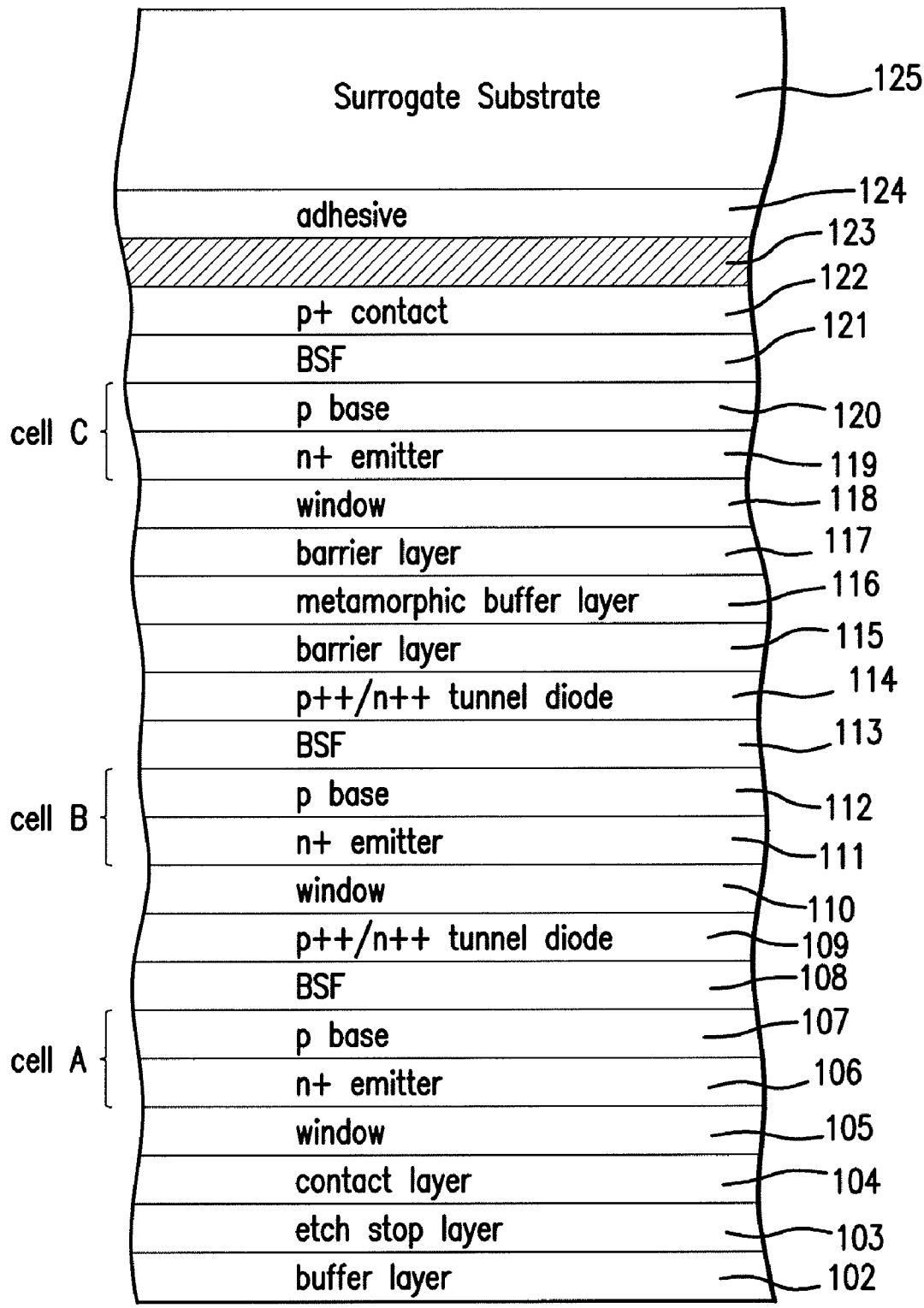
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed by a sequence of lapping and/or etching steps in which the substrate 101, and the buffer layer 103 are removed. The choice of a particular etchant is growth substrate dependent.

Figure 5C:
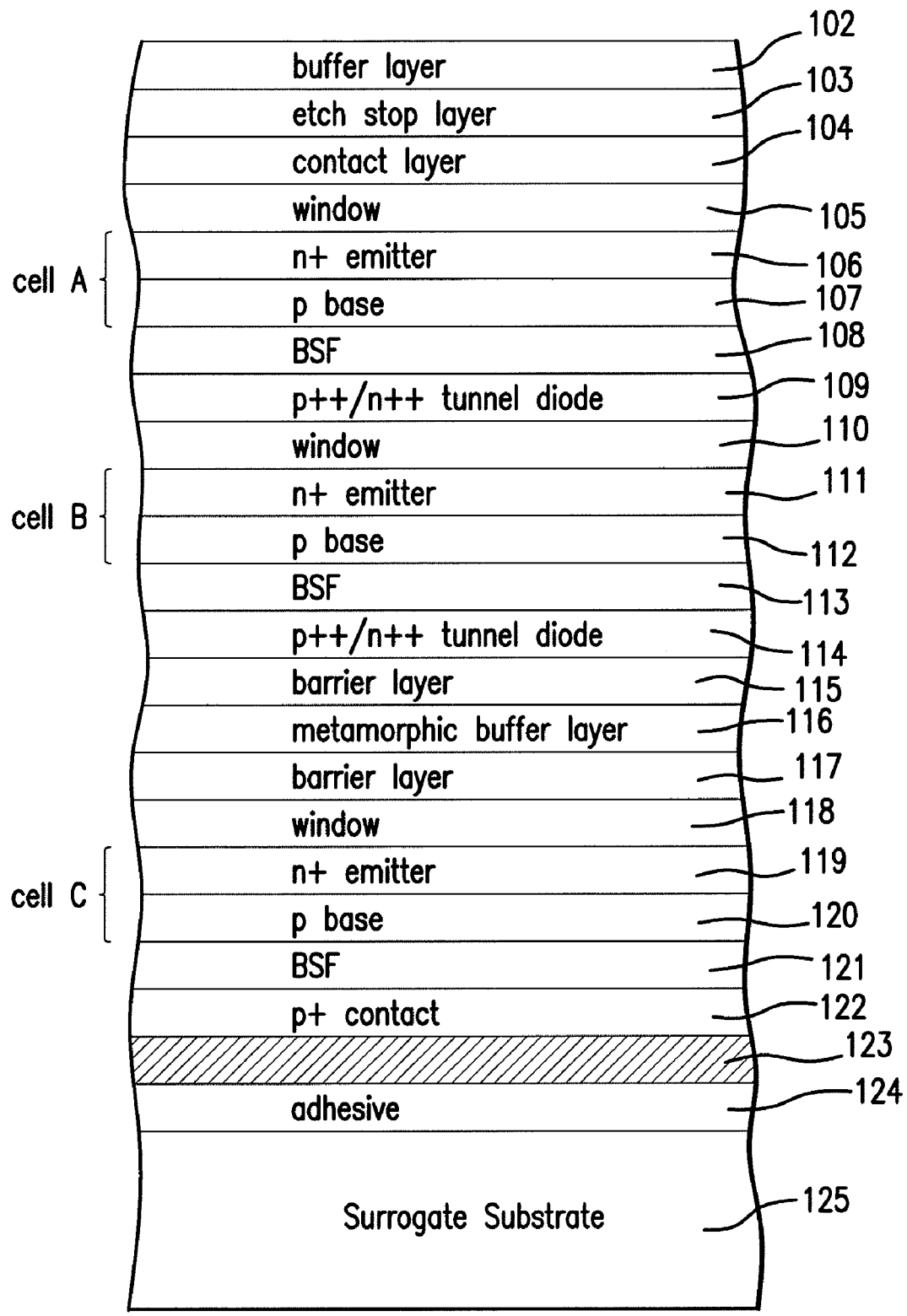
FIG. 5C is another cross-sectional view of the solar cell of FIG. 5B with the surrogate substrate on the bottom of the Figure.

FIG. 5C is a cross-sectional view of the solar cell of FIG. 5B with the orientation with the surrogate substrate 125 being at the bottom of the Figure. Subsequent Figures in this application will assume such orientation.

Figure 6:
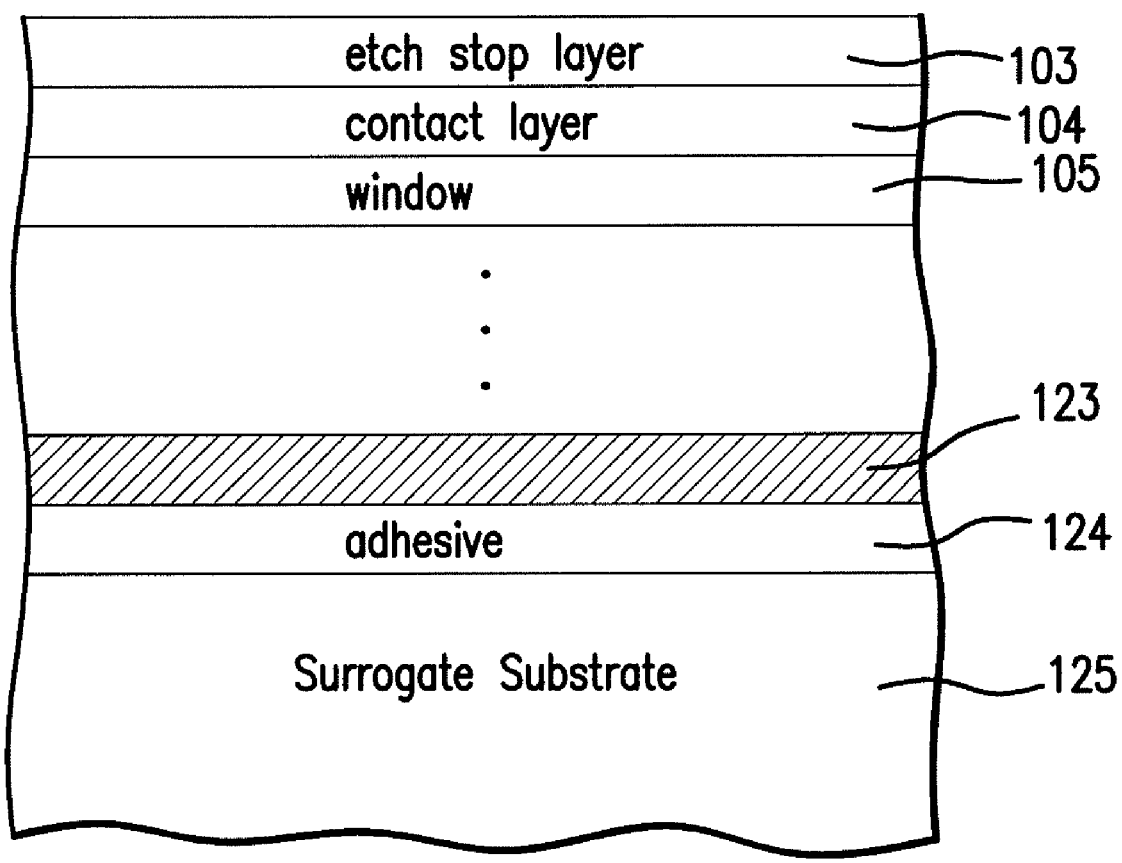
FIG. 6 is a simplified cross-sectional view of the solar cell of FIG. 5C after the next process step.

FIG. 6 is a simplified cross-sectional view of the solar cell of FIG. 5B depicting just a few of the top layers and lower layers over the surrogate substrate 125.

Figure 7:
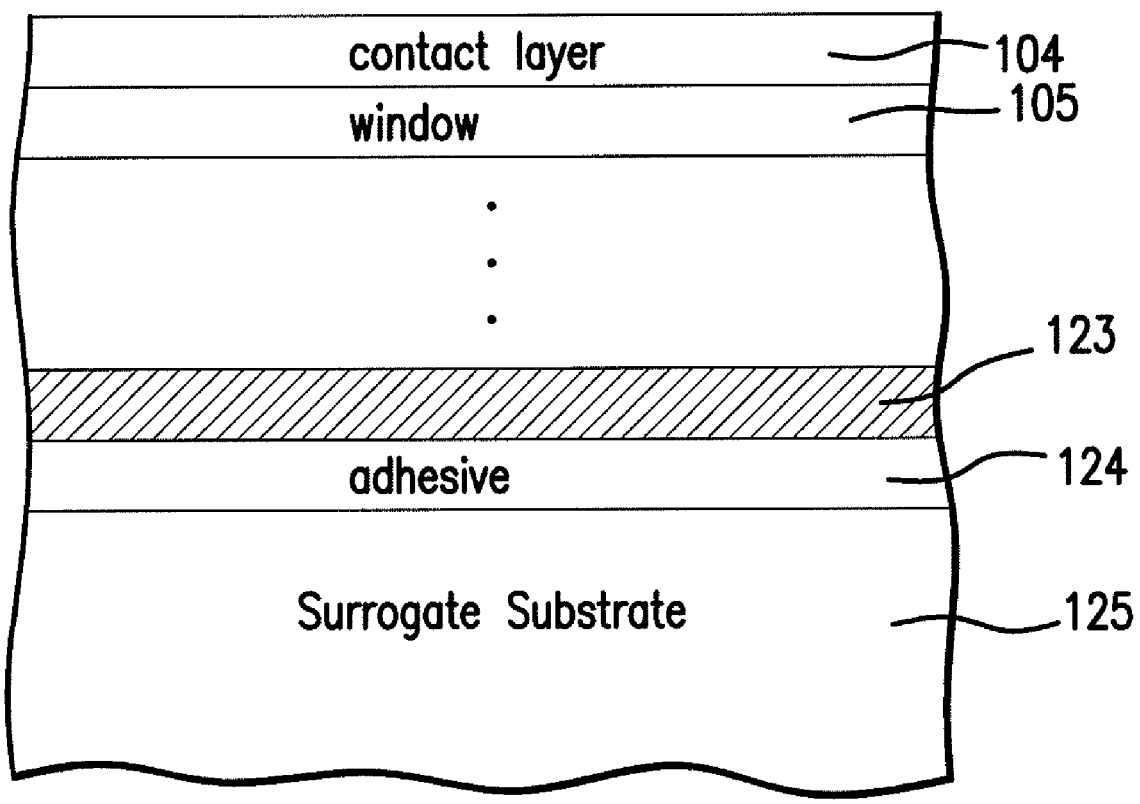
FIG. 7 is a cross-sectional view of the solar cell of FIG. 6 after the next process step.

FIG. 7 is a cross-sectional view of the solar cell of FIG. 6 after the next process step in which the etch stop layer 103 is removed by a HCl/H$_2$O solution.

Figure 8:
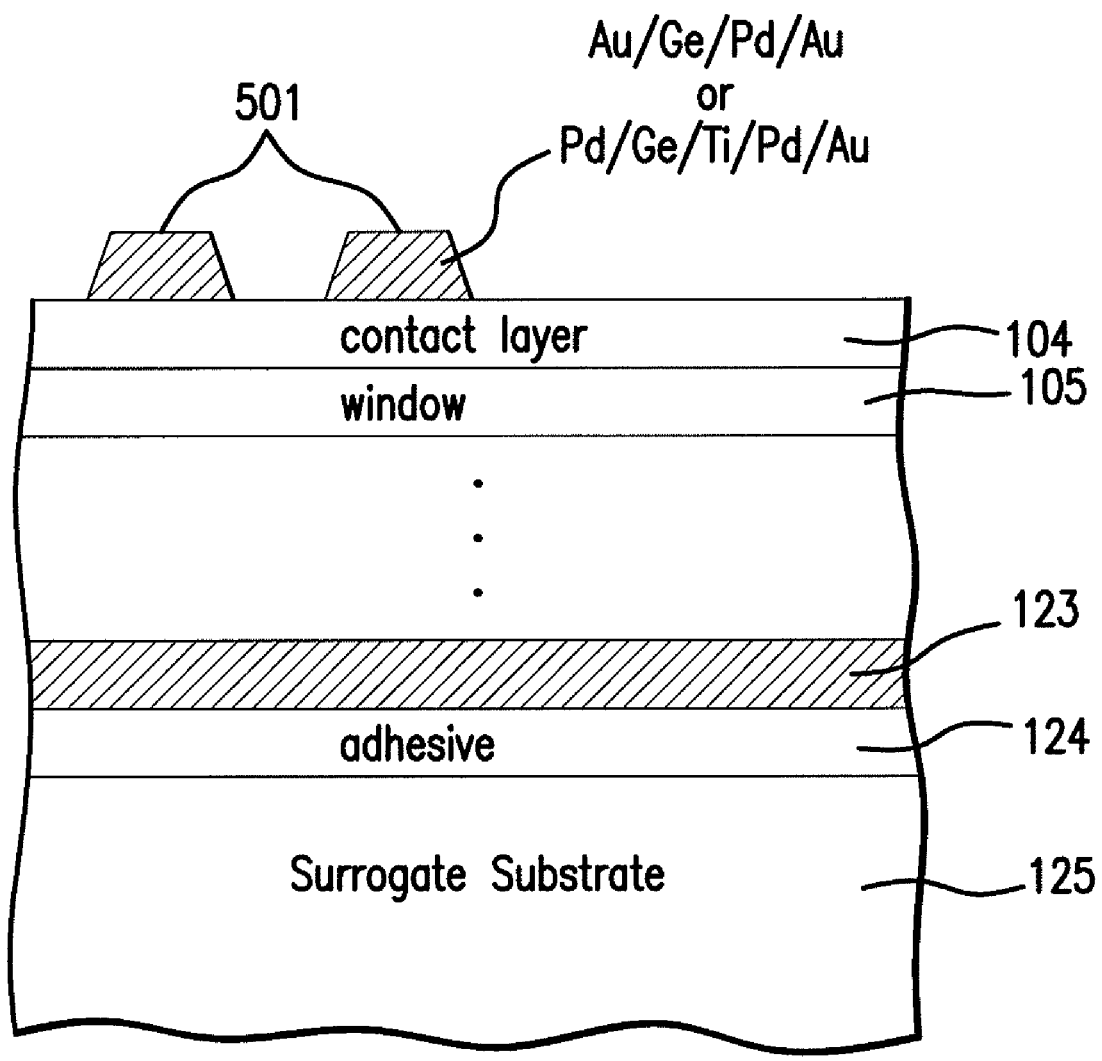
FIG. 8 is a cross-sectional view of the solar cell of FIG. 7 after the next process step.

FIG. 8 is a cross-sectional view of the solar cell of FIG. 7 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. patent application Ser. No. 12/218,582 filed Jul. 18, 2008, hereby incorporated by reference, the grid lines 501 are preferably composed of Pd/Ge/Ti/Pd/Au, although other suitable materials may be used as well.

Figure 9:
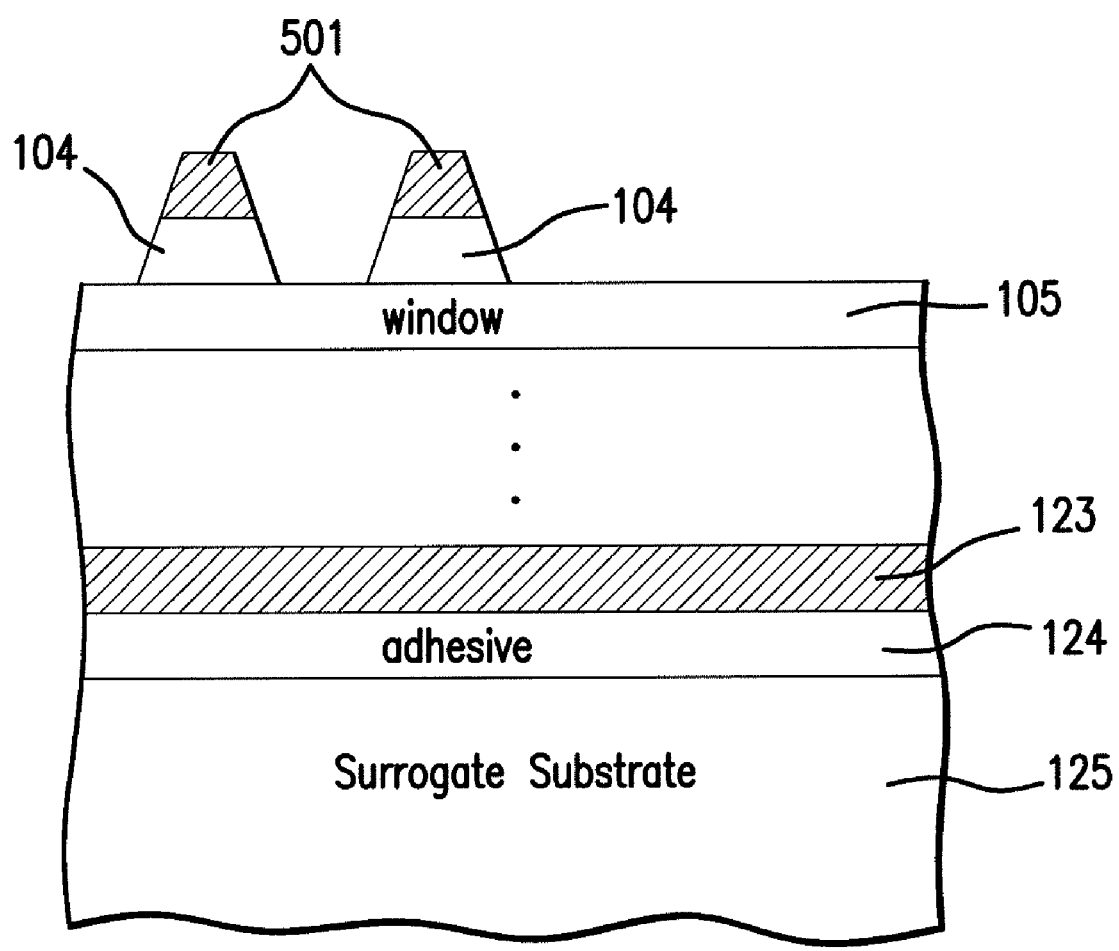
FIG. 9 is a cross-sectional view of the solar cell of FIG. 8 after the next process step.

FIG. 9 is a cross-sectional view of the solar cell of FIG. 8 after the next process step in which the grid lines are used as a mask to etch down the surface to the window layer 105 using a citric acid/peroxide etching mixture.

Figure 10A:
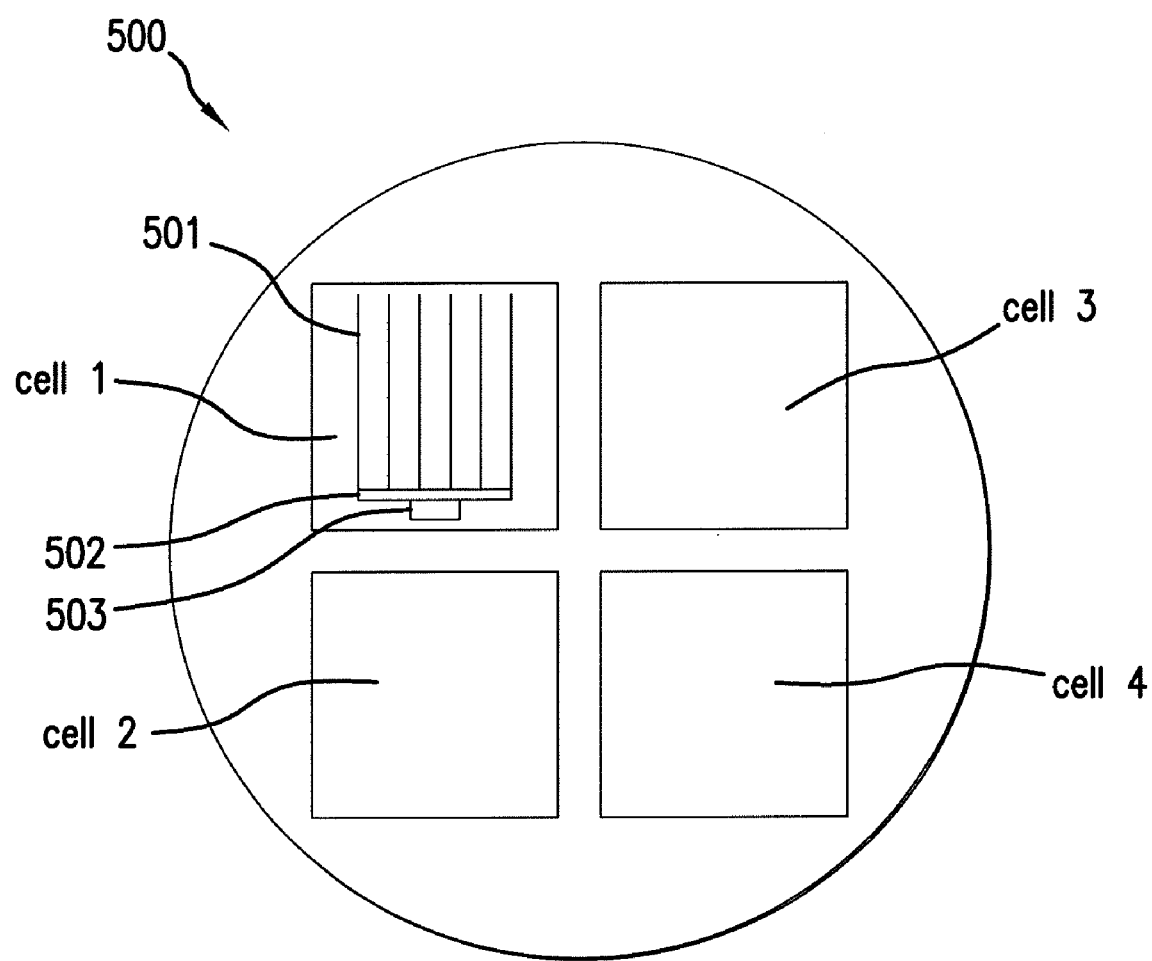
FIG. 10A is a top plan view of a wafer in which the solar cells are fabricated.

FIG. 10A is a top plan view of a wafer in which four solar cells are implemented. The depiction of four cells is for illustration for purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines and the contact pad are illustrative and the present invention is not limited to the illustrated embodiment.

Figure 10B:
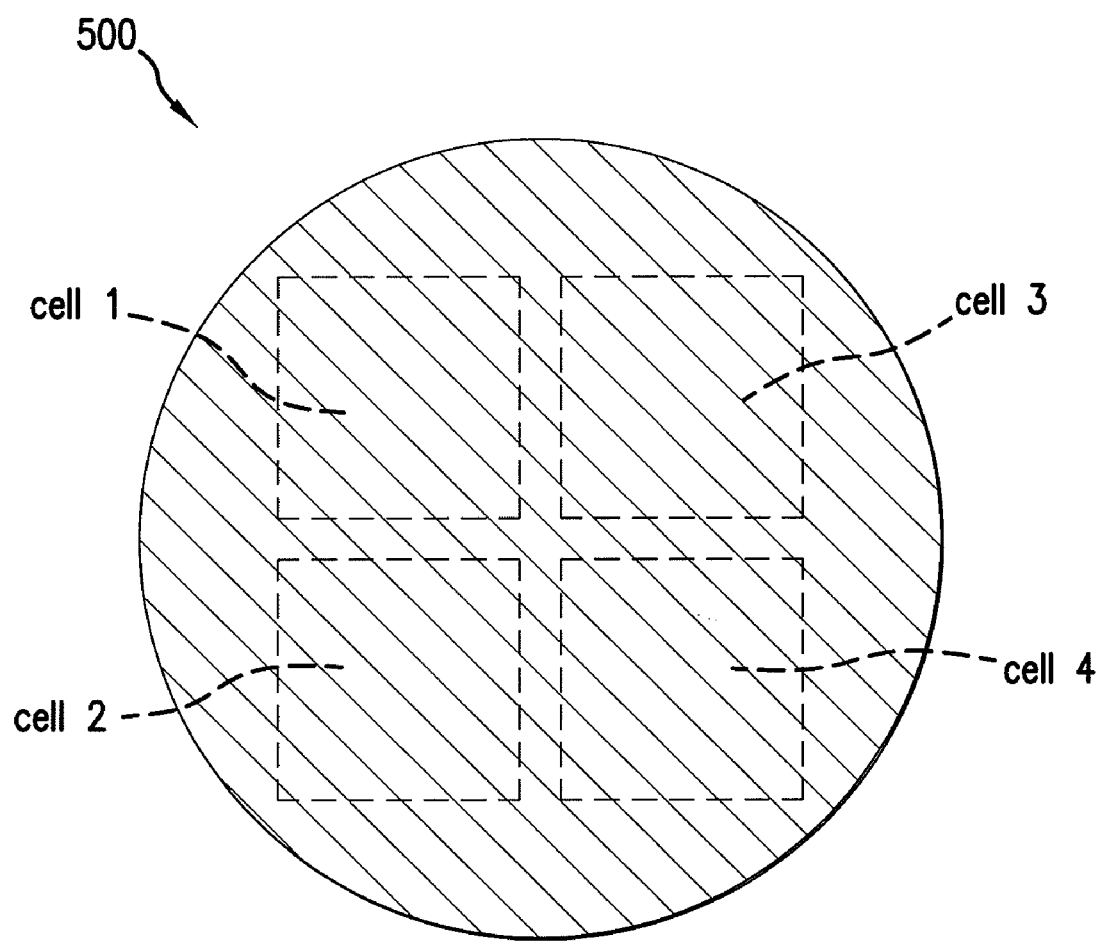
FIG. 10B is a bottom plan view of a wafer in which the solar cells are fabricated.

FIG. 10B is a bottom plan view of the wafer with four solar cells shown in FIG. 10A.

Figure 11:
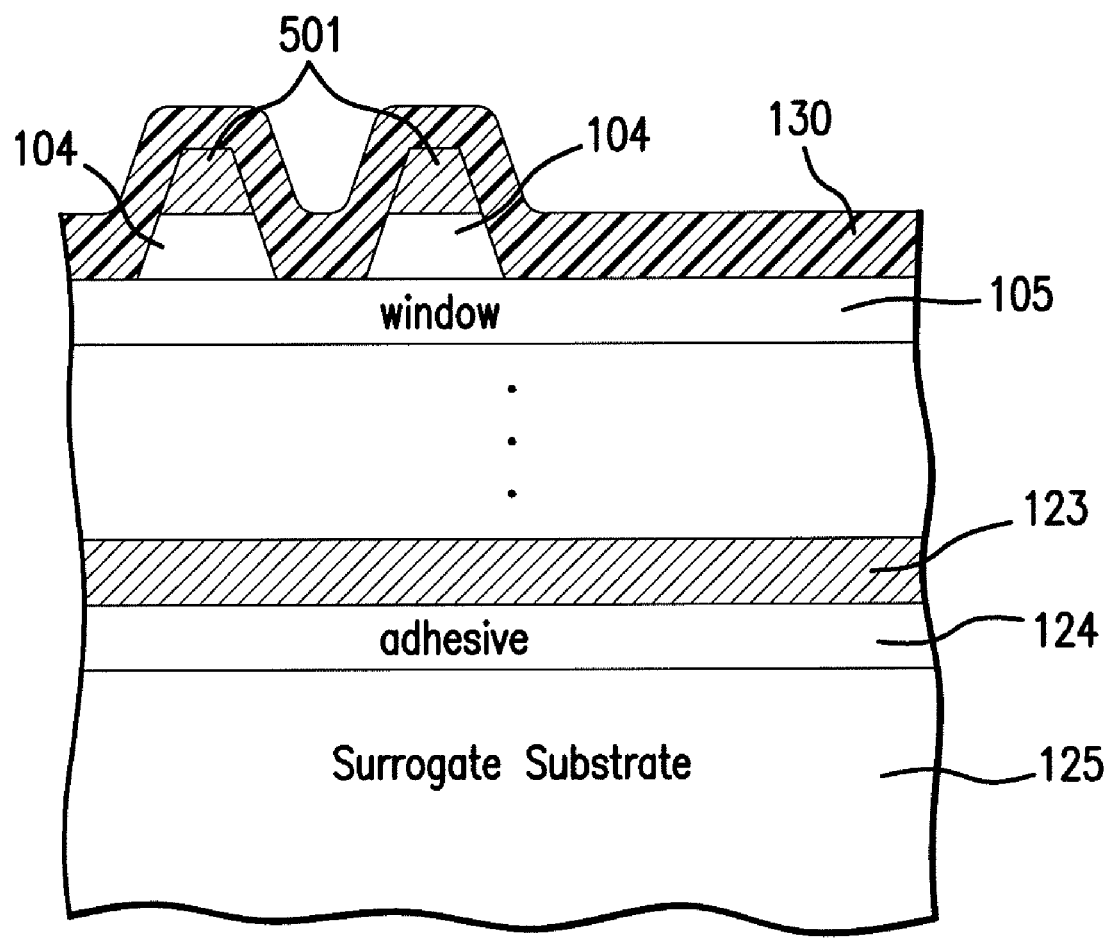
FIG. 11 is a cross-sectional view of the solar cell of FIG. 9 after the next process step.

FIG. 11 is a cross-sectional view of the solar cell of FIG. 9 after the next process step in which an antireflective (ARC) dielectric coating layer 130 is applied over the entire surface of the "bottom" side of the wafer with the grid lines 501.

Figure 12A:
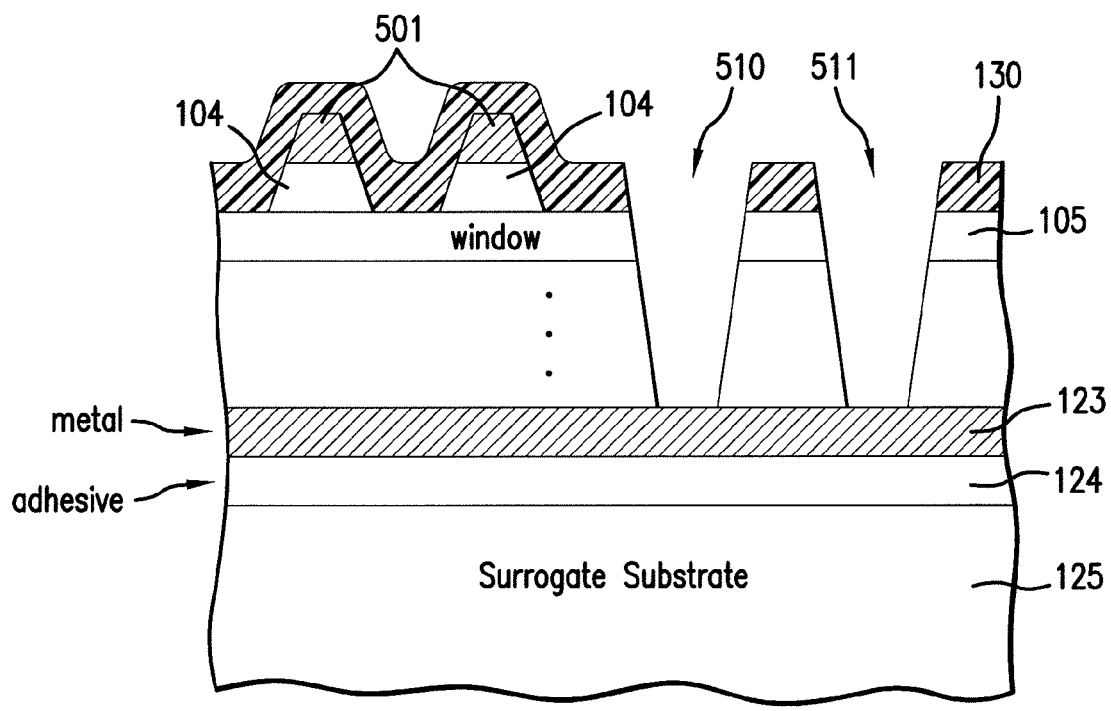
FIG. 12A is a cross-sectional view of the solar cell of FIG. 11 after the next process step.

FIG. 12A is a cross-sectional view of the solar cell of FIG. 11 after the next process step according to the present invention in which first and second annular channels 510 and 511, or portion of the semiconductor structure are etched down to the metal layer 123 using phosphide and arsenide etchants. These channels define a peripheral boundary between the cell and the rest of the wafer, and leaves a mesa structure which constitutes the solar cell. The cross-section depicted in FIG. 12A is that as seen from the A-A plane shown in FIG. 13. In a preferred embodiment, channel 510 is substantially wider than that of channel 511.

Figure 12B:
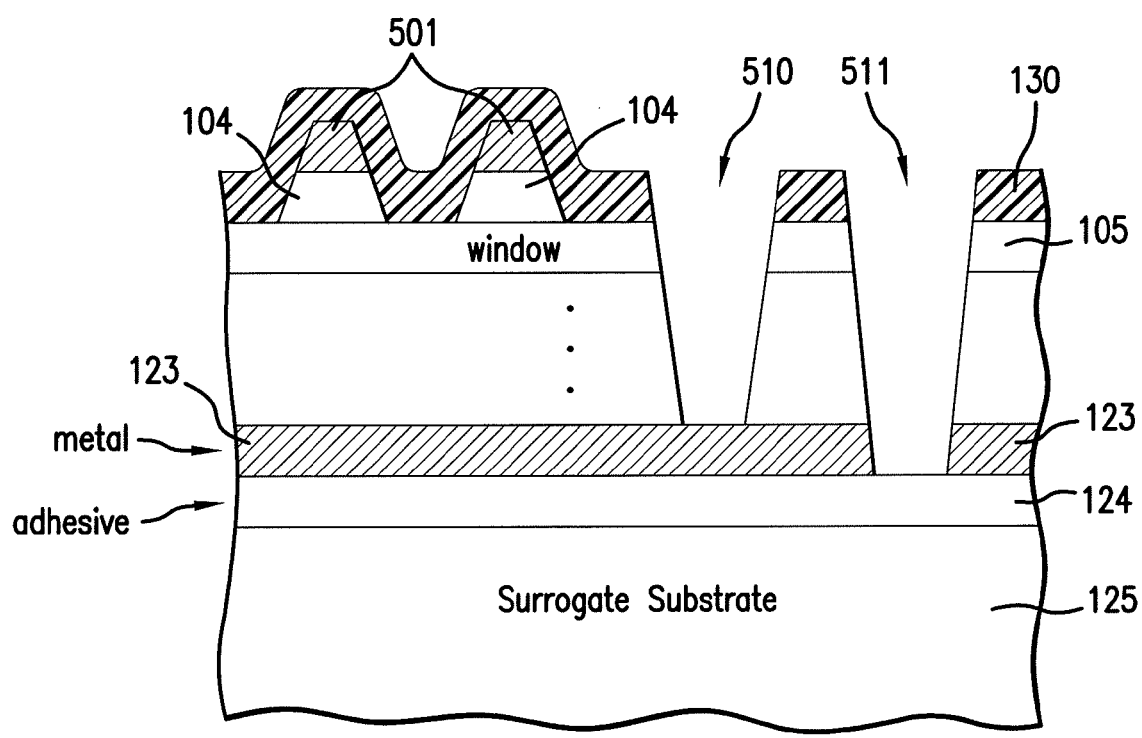
FIG. 12B is a cross-sectional view of the solar cell of FIG. 12A after the next process step.

FIG. 12B is a cross-sectional view of the solar cell of FIG. 12A after the next process step in which channel 511 is exposed to a metal etchant, layer 123 in the channel 511 is removed, and channel 511 is extended in depth approximately to the top surface of the adhesive layer 124.

Figure 13:
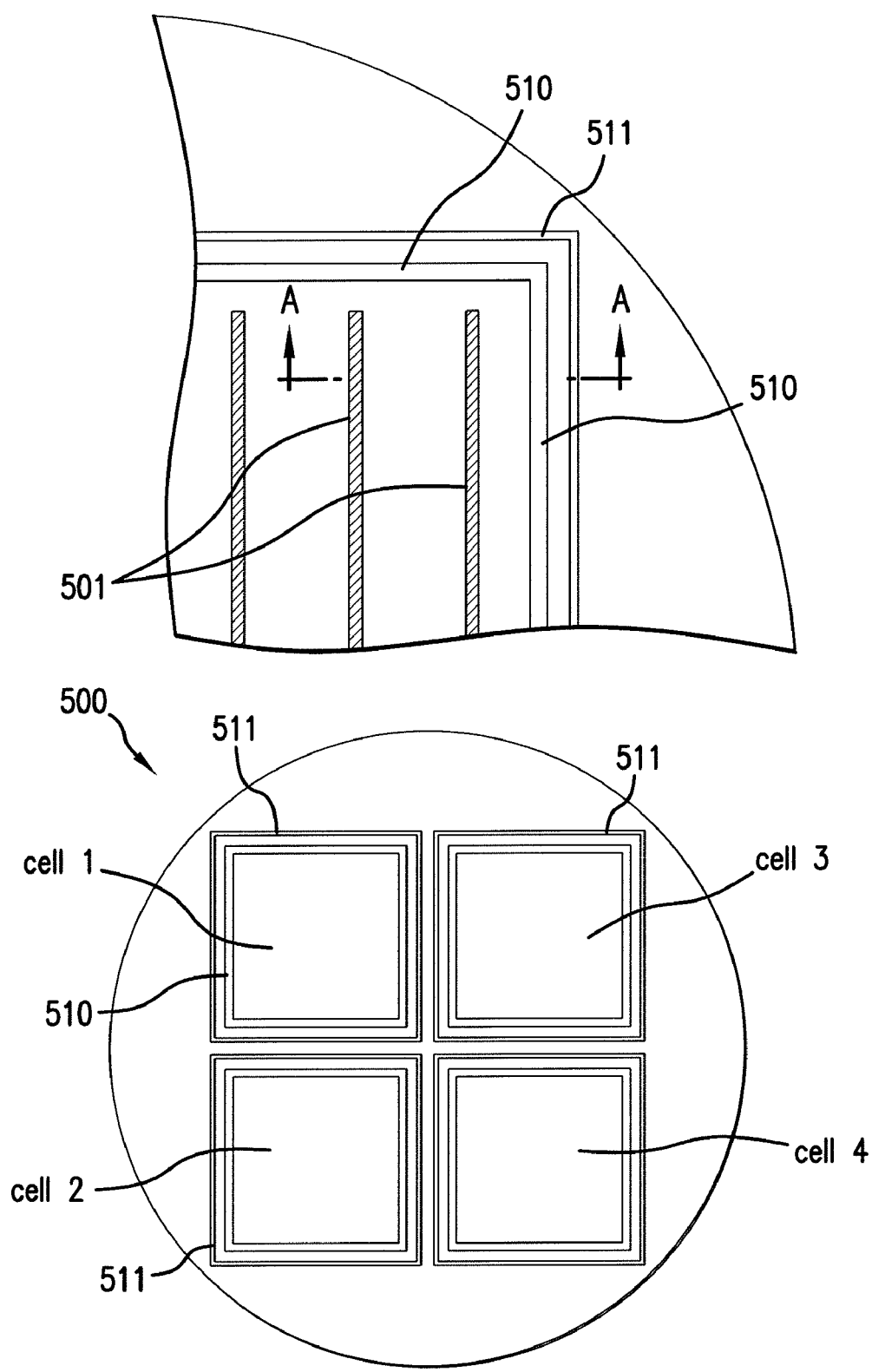
FIG. 13 is a top plan view of the wafer of FIG. 12 depicting the surface view of the trench etched around the cell, after the next process step.

FIG. 13 is a top plan view of the wafer of FIGS. 12A and 12B depicting the channels 510 and 511 etched around the periphery of each cell.

Figure 14A:
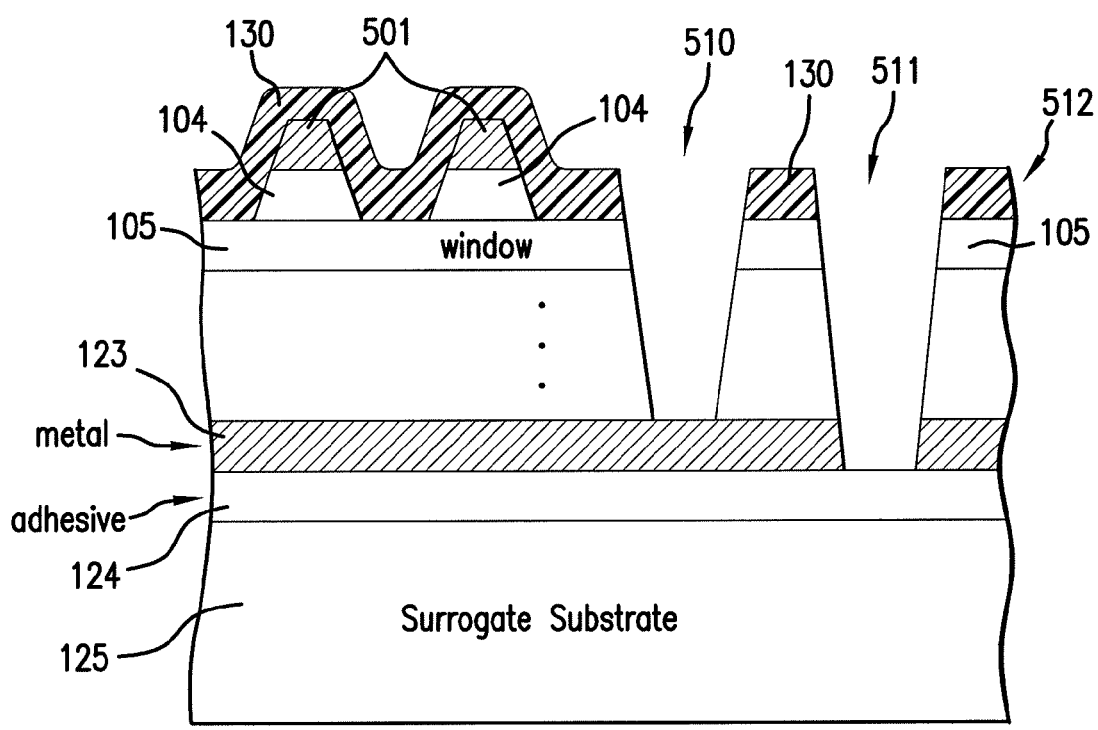
FIG. 14A is a cross-sectional view of the solar cell of FIG. 12 after the next process step in a first embodiment of the present invention.

FIG. 14A is a cross-sectional view of the solar cell of FIG. 12 after the next process step in a first embodiment of the present invention in which the surrogate substrate 125 is appropriately thinned to a relatively thin layer 125a, by grinding, lapping, or etching.

Figure 14B:
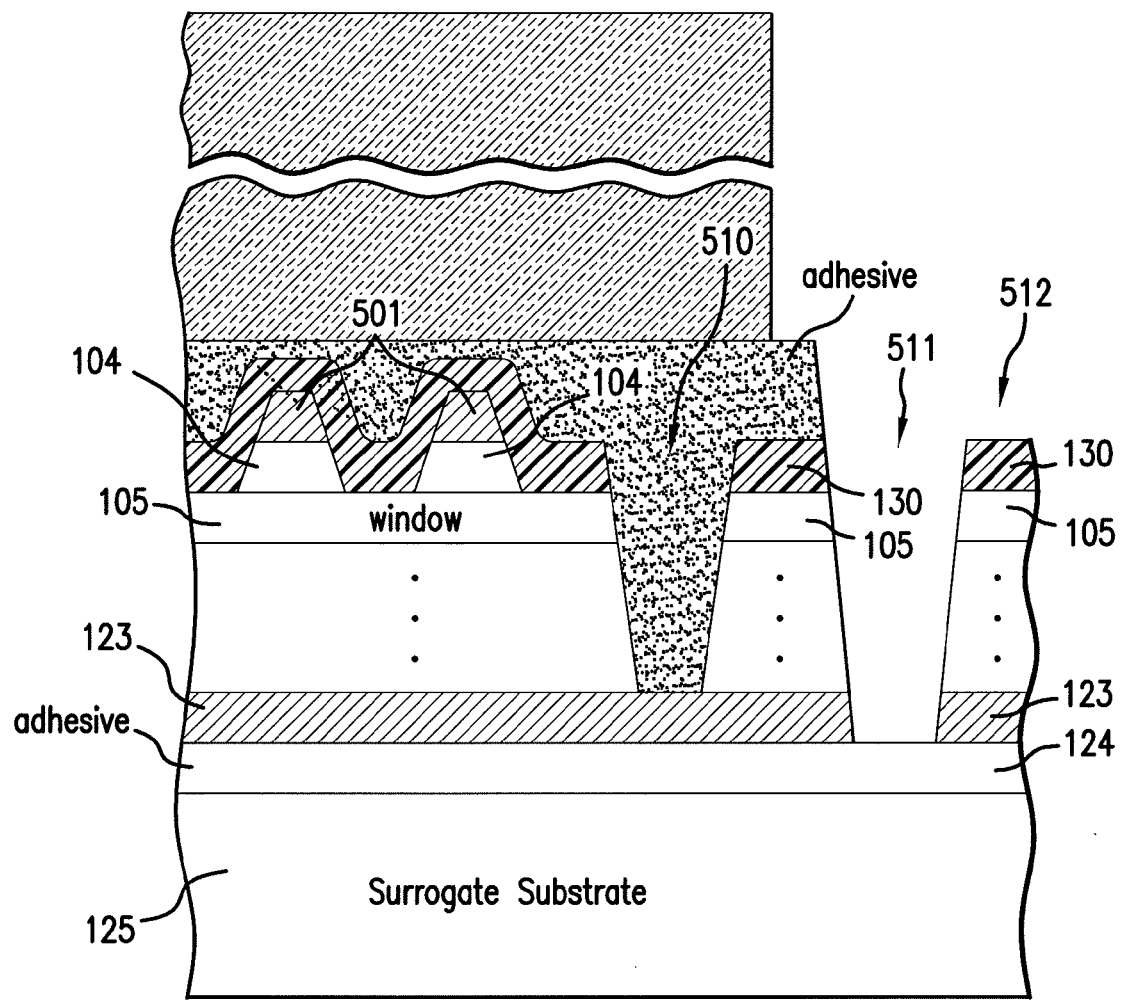
FIG. 14B is a cross-sectional view of the solar cell of FIG. 14A after the next process step in a second embodiment of the present invention.

FIG. 14B is a cross-sectional view of the solar cell of FIG. 14A after the next process step in a second embodiment of the present invention in which a cover glass 513 is secured to the top of the cell by an adhesive. The cover glass 513 preferably covers the entire channel 510, but does not extend to channel 511.

Figure 15:
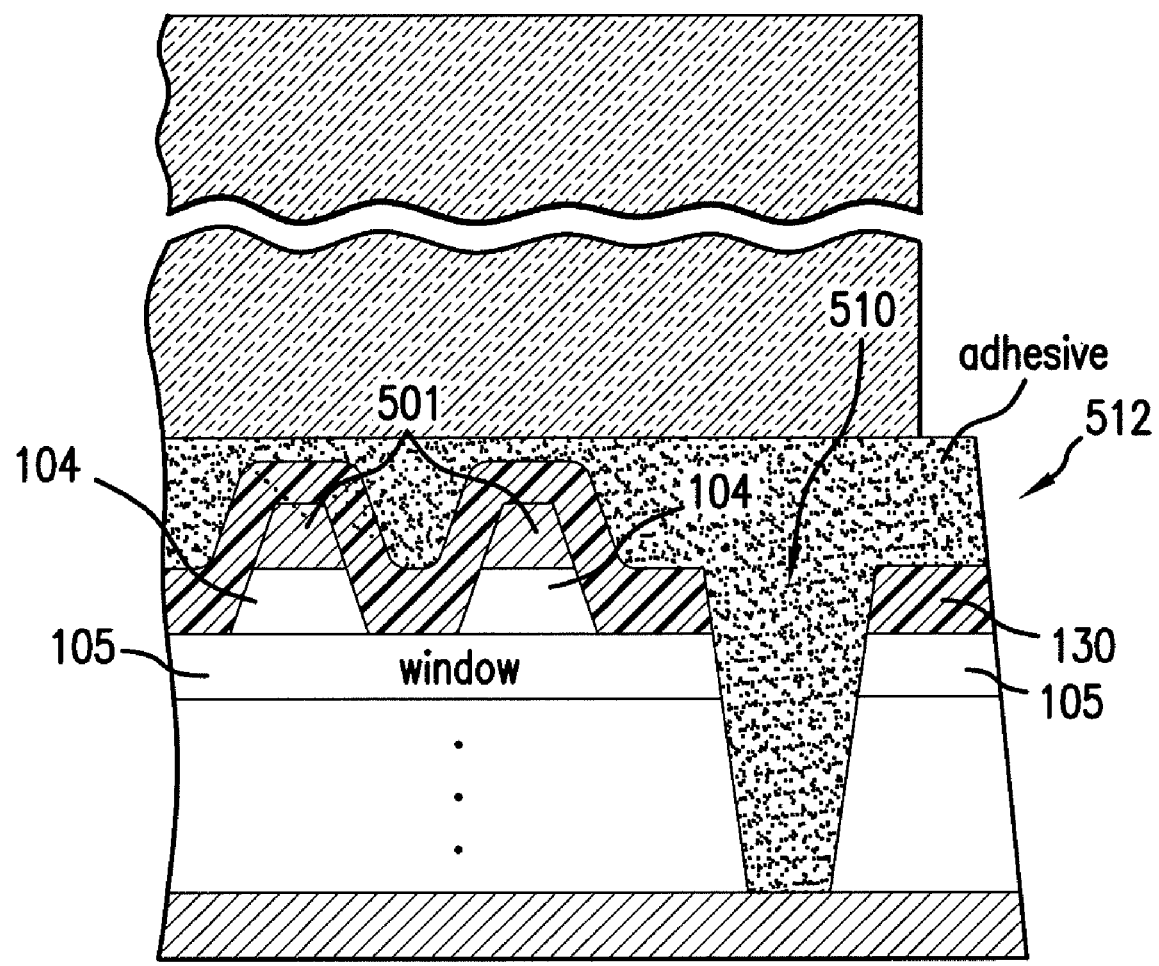
FIG. 15 is a cross-sectional view of the solar cell of FIG. 14B after the next process step in a third embodiment of the present invention.

FIG. 15 is a cross-sectional view of the solar cell of FIG. 14B after the next process step of the present invention in which the adhesive layer 124, the surrogate substrate 125 and the peripheral portion 512 of the wafer is entirely removed, leaving only the solar cell with the cover glass 513 on the top, and the metal contact layer 123 on the bottom, which forms the backside contact of the solar cell. The surrogate substrate may be reused in subsequent wafer processing operations.

Figure 16:
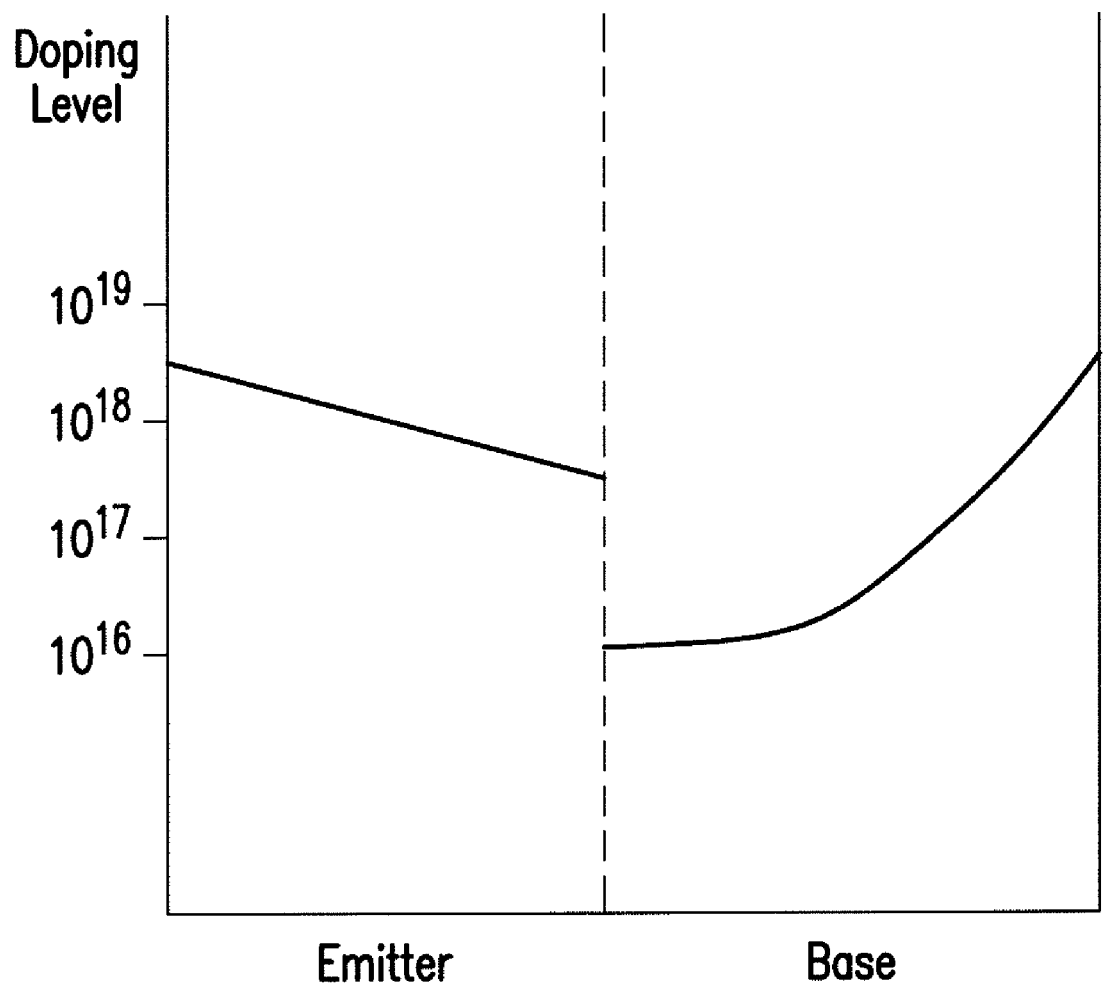
FIG. 16 is a graph of the doping profile in a base layer in the metamorphic solar cell according to the present invention.

FIG. 16 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 17:
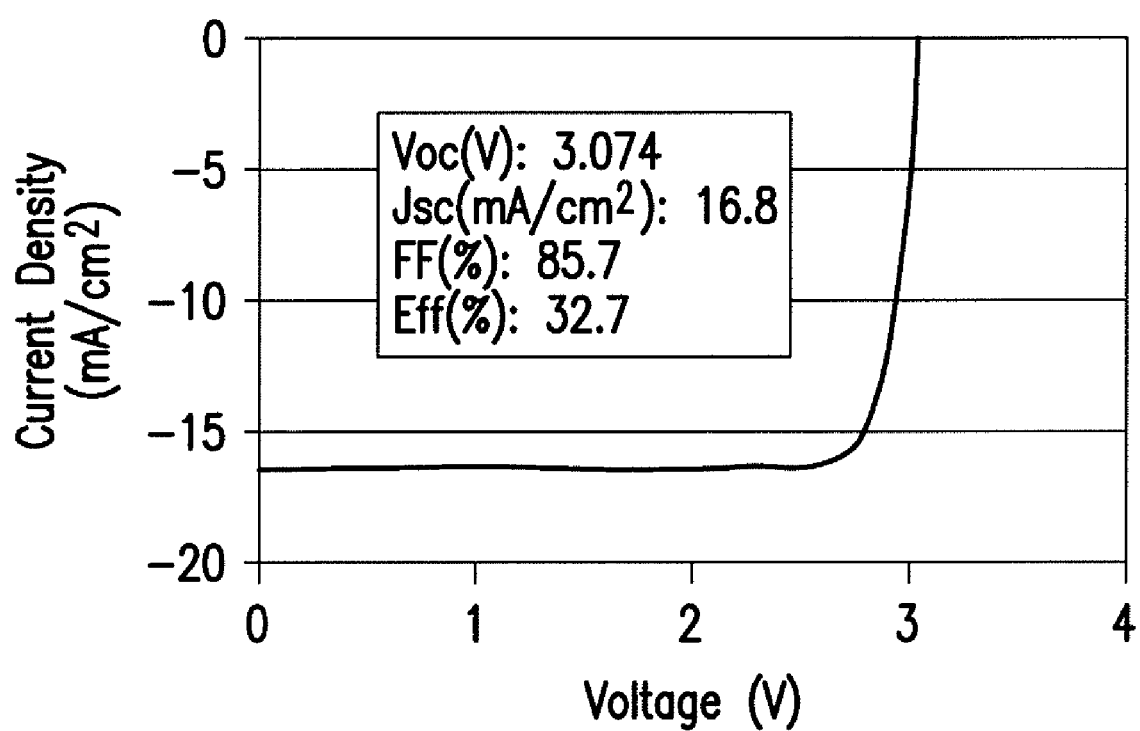
FIG. 17 is a graph that depicts a graph of the current and voltage characteristics of an inverted metamorphic multijunction solar cell according to the present invention.

FIG. 17 is a graph that depicts the current and voltage characteristics of the solar cell according to the present invention.

The solar cell has an open circuit voltage ($V_{oc}$) of approximately 3.074 volts, a short circuit current of approximately 16.8 mA/cm$^2$, a fill factor of approximately 85.7%, and an efficiency of 32.7%.

It will be understood that each of the elements described above, or two or more together, also may find a useful application in other types of constructions differing from the types of constructions described above.

Although the preferred embodiment of the present invention utilizes a vertical stack of three subcells, the present invention can apply to stacks with fewer or greater number of subcells, i.e. two junction cells, four junction cells, five junction cells, etc. In the case of four or more junction cells, the use of more than one metamorphic grading interlayer may also be utilized.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in a inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A method of manufacturing a solar cell comprising:
   providing a first semiconductor substrate;
   depositing on a first substrate a sequence of layers of semiconductor material forming a solar cell including a metal contact layer;
   mounting a surrogate second substrate on top of the sequence of layers;
   removing the first substrate;
   simultaneously etching first and second troughs around the periphery of said solar cell wherein the first trough lies within the second trough so as to form first and second mesa structures on the surrogate second substrate; and
   etching said second trough down to said metal contact layer.

2. The method as defined in claim 1, wherein the sequence of layers of semiconductor material forms a triple junction solar cell, including top, middle and bottom solar subcells.

3. The method as defined in claim 1, wherein the mounting step includes adhering the solar cell to the surrogate substrate.

4. The method as defined in claim 1, wherein the surrogate substrate is selected from the group of sapphire, Ge, GaAs, or silicon.

5. The method as defined in claim 1, wherein the solar cell is bonded to said surrogate substrate by an adhesive.

6. The method as defined in claim 1, wherein the solar cell is bonded to the surrogate substrate.

7. The method as defined in claim 1, further comprising thinning the surrogate substrate to a predetermined thickness.

8. The method as defined in claim 1, further mounting the solar cell on a rigid coverglass; and removing the surrogate substrate.

9. A method as defined in claim 2, wherein said middle and bottom subcells are lattice mismatched.

10. A method as defined in claim 2, further comprising a graded interlayer disposed between said middle and bottom subcells, and has a band gap greater than the band gap of said middle subcell.

11. A method as defined in claim 10, wherein said graded interlayer is composed of any of the As, P, N, Sb based III-V compound semiconductors subject to the constraints of having the in-plane lattice parameter greater or equal to that of the middle subcell and less than or equal to that of the bottom subcell.

12. A method as defined in claim 10, wherein the graded interlayer is composed of $(In_xGa_{1-x})_yAl_{1-y}As$, with x and y selected such that the band gap of the interlayer remains constant at approximately 1.50 eV.

* * * * *

UNITED STATES PATENT AND TRADEMARK OFFICE
CERTIFICATE OF CORRECTION

PATENT NO.       : 7,741,146 B2
APPLICATION NO.  : 12/190449
DATED            : June 22, 2010
INVENTOR(S)      : Arthur Cornfeld, Tansen Varghese and Jacqueline Diaz Page 1 of 1

It is certified that error appears in the above-identified patent and that said Letters Patent is hereby corrected as shown below:

In the Abstract, first line, "multifunction" should be changed to --multijunction--.

Column 1, line 14, "Jul. 18, 2008" should be changed to --Jul. 16, 2008--; line 16, "Jul. 17, 2008" should be changed to --Jul. 16, 2008--; line 32, "Aug. 8, 2007" should be changed to --Aug. 9, 2007--; line 49, "multifunction" should be changed to --multijunction--.

Column 2, line 5, "multifunction" should be changed to --multijunction--; line 26, "multifunction" should be changed to --multijunction--; line 30, "multifunction" should be changed to --multijunction--.

Column 4, line 14, "that depicts a graph" should be deleted; line 38, "lattice-matched" should read --lattice matched--; line 43, "lattice-mismatched" should read --lattice mismatched--; line 48, "lattice-mismatched" should read --lattice mismatched--.

Column 5, line 37, "latticed" should be --lattice--; line 41, "bandgap" should read --band gap--; line 43, "(T)" should read --(Tl)--; line 45, "phosphorous" should be --phosphorus--; line 65, "18" should be changed to --108--.

Column 6, line 19, "bandgap" should read --band gap--; line 33, "then" should be changed to --than--; line 44, "compound" should be changed to --composed--; line 60, "bandgap" should read --band gap--; line 63, "bandgap" should read --band gap--.

Column 7, lines 27, 33, 37, 38 and 57, "bandgap" should read --band gap--.

Column 8, line 11, "bandgap" should read --band gap--; line 22, "multifunction" should be changed to --multijunction--; line 50, "Alternative" should be changed to --Alternatively--.

Column 9, line 16, "Jul. 18, 2008" should be changed to --Jul. 16, 2008--; line 26, delete "for"; line 45, "leaves" should read as --leave--.

Column 11, line 15, change "a" to --an--.

Signed and Sealed this

Fourteenth Day of September, 2010

David J. Kappos
*Director of the United States Patent and Trademark Office*